(12) United States Patent
Baek et al.

(10) Patent No.: US 11,460,744 B2
(45) Date of Patent: Oct. 4, 2022

(54) DISPLAY DEVICE AND METHOD OF MANUFACTURING THE SAME

(71) Applicant: Samsung Display Co., Ltd., Yongin-Si (KR)

(72) Inventors: Gyungmin Baek, Yongin-si (KR); Hyuneok Shin, Gwacheon-si (KR); Juhyun Lee, Seongnam-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 17/105,360

(22) Filed: Nov. 25, 2020

(65) Prior Publication Data
US 2021/0318564 A1 Oct. 14, 2021

(30) Foreign Application Priority Data
Apr. 10, 2020 (KR) .......................... 10-2020-0044288

(51) Int. Cl.
*G02F 1/1368* (2006.01)
*G02F 1/1362* (2006.01)
*H01L 27/12* (2006.01)

(52) U.S. Cl.
CPC ...... *G02F 1/1368* (2013.01); *G02F 1/136286* (2013.01); *H01L 27/124* (2013.01); *H01L 27/127* (2013.01); *H01L 27/1225* (2013.01)

(58) Field of Classification Search
CPC ............. G02F 1/136286; G02F 1/1368; H01L 27/1225; H01L 27/124; H01L 27/127
See application file for complete search history.

(56) References Cited

U.S. PATENT DOCUMENTS

| | | | | |
|---|---|---|---|---|
| 5,162,933 A | * | 11/1992 | Kakuda | G02F 1/136286 349/46 |
| 6,624,473 B1 | * | 9/2003 | Takehashi | H01L 29/78627 257/344 |
| 10,386,687 B2 | | 8/2019 | Yang et al. | |
| 2012/0244659 A1 | * | 9/2012 | Imoto | H01L 29/7869 438/104 |
| 2012/0248443 A1 | * | 10/2012 | Katsui | G02F 1/133345 257/57 |
| 2013/0099239 A1 | * | 4/2013 | Ishii | G09G 1/00 257/59 |

(Continued)

FOREIGN PATENT DOCUMENTS

| | | |
|---|---|---|
| KR | 10-2006-0121414 A | 11/2006 |
| KR | 10-2019-0031393 A | 3/2019 |
| WO | WO-2010073824 A1 * 7/2010 | ....... G02F 1/133502 |

*Primary Examiner* — Hoan C Nguyen
(74) *Attorney, Agent, or Firm* — Innovation Counsel LLP

(57) ABSTRACT

A display device includes a base layer, a pixel disposed on the base layer and including a thin film transistor, and a signal line connected to the pixel. The signal line includes a metal layer and a capping layer disposed on the metal layer, including molybdenum and tantalum. The metal layer has a first light reflectance, and the capping layer has a second light reflectance that is lower than the first light reflectance of the metal layer. The capping layer includes a tip protruding from a sidewall of the metal layer, and the tip protrudes more than a contact point at which the sidewall of the metal layer contacts with the base layer when viewed in a plane. The display device has an improved external light reflection characteristic and an enhanced display quality.

18 Claims, 13 Drawing Sheets

(56) References Cited

U.S. PATENT DOCUMENTS

| | | | |
|---|---|---|---|
| 2014/0291672 A1* | 10/2014 | Yamazaki | H01L 27/124 |
| | | | 257/43 |
| 2015/0364507 A1* | 12/2015 | Won | G06F 3/0412 |
| | | | 257/43 |
| 2019/0004616 A1 | 1/2019 | Baek et al. | |
| 2019/0086754 A1* | 3/2019 | Yang | H01L 27/1218 |
| 2019/0148412 A1* | 5/2019 | Shida | H01L 21/285 |
| | | | 257/43 |

* cited by examiner (a)

(b)

(c)

(d)

DISPLAY DEVICE AND METHOD OF MANUFACTURING THE SAME

CROSS-REFERENCE TO RELATED APPLICATION

This U.S. non-provisional patent application claims priority under 35 U.S.C. § 119 of Korean Patent Application No. 10-2020-0044288, filed on Apr. 10, 2020, the disclosure of which is hereby incorporated by reference in its entirety.

BACKGROUND

1. Field of Disclosure

The present disclosure relates to a display device and a method of manufacturing the same. More particularly, the present disclosure relates to a display device capable of imparting a low optical reflection characteristic and a method of manufacturing the display device.

2. Description of the Related Art

A display device includes signal lines and electronic elements that are connected to the signal lines to display an image. The signal lines and the electronic elements are formed by a conductive layer. The conductive layer including a metal material may be observable to a user by an external light reflected by the metal material included in the conductive layer. Due to the reflection of the external light, the signal lines or the electronic elements may exert an influence on a visibility of an image displayed by the display device.

SUMMARY

The present disclosure provides a display device capable of maintaining a low reflection characteristic.

The present disclosure also provides a method of manufacturing the display device.

According to one embodiment, a display device includes a base layer; a pixel disposed on the base layer and including a thin film transistor; and a signal line connected to the pixel. The signal line includes a metal layer having a first light reflectance and a capping layer disposed on the metal layer, including molybdenum and tantalum, and having a second light reflectance lower than the first light reflectance of the metal layer. The capping layer includes a tip protruding from a sidewall of the metal layer, and the tip protrudes more than a contact point at which the sidewall of the metal layer contacts with the base layer when viewed in a plane.

When a length d of the tip may satisfy a condition of $d \geq h/(\tan(90°-\theta_\alpha))+h/(\tan(\theta_\beta))$, wherein h denotes a first thickness of the metal layer, $\theta_\alpha$ denotes an outermost viewing angle of the display device, and $\theta_\beta$ denotes a taper angle of the metal layer.

The length d may be equal to or greater than about 4000 angstroms and equal to or smaller than about 6000 angstroms.

The h may be equal to or greater than about 5000 angstroms and equal to or smaller than about 10000 angstroms.

A content ratio of the molybdenum to the tantalum in the capping layer may be from about 80:20 to about 97:3.

The capping layer may have an average light reflectance equal to or smaller than about 20% in a wavelength range equal to or greater than about 400 nm and equal to or smaller than about 800 nm, and the capping layer may have a second thickness that is equal to or greater than about 500 angstroms and equal to or smaller than about 1500 angstroms.

The capping layer may include molybdenum oxide ($MoO_2$) and tantalum oxide (TaO).

The metal layer may include a first metal layer including a first metal material and a second metal layer including a second metal material, and the first metal layer and the second metal layer may be sequentially stacked.

The first metal layer includes a refractory metal including at least one of niobium (Nb), vanadium (V), tantalum (Ta), titanium (Ti), zirconium (Zr), hafnium (Hf), molybdenum (Mo), rhenium (Re), or tungsten (W), and the second metal layer may include copper (Cu), silver (Ag), aluminum (Al) or an alloy thereof.

The metal layer may include a metal layer main body including a metal material and a metal oxide layer disposed on a side surface of the metal layer main body. The metal oxide layer may correspond to the sidewall of the metal layer.

The metal oxide layer may include titanium oxide or copper oxide.

The metal oxide layer may include a first metal oxide layer including a first oxide of the first metal material and disposed on a first side surface of the first metal layer and a second metal oxide layer including a second oxide of the second metal material and disposed on a second side surface of the second metal layer.

The capping layer may contact with the metal layer.

The display device may further include a first signal line disposed in a first layer and a second signal line disposed in a second layer that is different from the first layer, the first signal line and the second signal line may be spaced apart from each other with an insulating layer interposed between the first signal line and the second signal line, the thin film transistor may include a control electrode disposed in the first layer, an input electrode disposed in the second layer, and an output electrode disposed in the second layer and spaced apart from the input electrode. A display element of the pixel may be connected to the output electrode, and at least one of the control electrode, the input electrode, and the output electrode may include the metal layer and the capping layer.

The sidewall of the metal layer may entirely overlap the tip when viewed in the plane.

According to another embodiment, a method of manufacturing a display device includes: providing a conductive layer on a base layer; providing an oxide layer including molybdenum and tantalum on the conductive layer; forming a photoresist pattern on the oxide layer; and etching the conductive layer and the oxide layer to form a signal line including a metal layer and a capping layer. The capping layer includes a tip protruding from a sidewall of the metal layer, and the tip protrudes more than a contact point at which the sidewall of the metal layer contacts with the base layer when viewed in a plane.

A length d of the tip may satisfy a condition of $d \geq h/(\tan(90°-\theta_\alpha))+h/(\tan(\theta_\beta))$.

The method may further include heat-treating the signal line under an oxygen condition to form a metal oxide layer.

A content ratio of the molybdenum to the tantalum in the oxide layer may be from about 80:20 to about 97:3.

According to the above, the capping layer disposed on the metal layer in the signal line of the display device includes the tip protruded from the sidewall of the metal layer. Therefore, the reflection of the external light not only by an upper surface of the metal layer but also by an inclination surface of the metal layer may be prevented. Thus, external light reflection characteristics of the display device may be improved.

BRIEF DESCRIPTION OF THE DRAWINGS

The inventive concepts of the present disclosure will become readily apparent by reference to the following detailed description in conjunction with the accompanying drawings wherein.

DETAILED DESCRIPTION

Figure 1A:
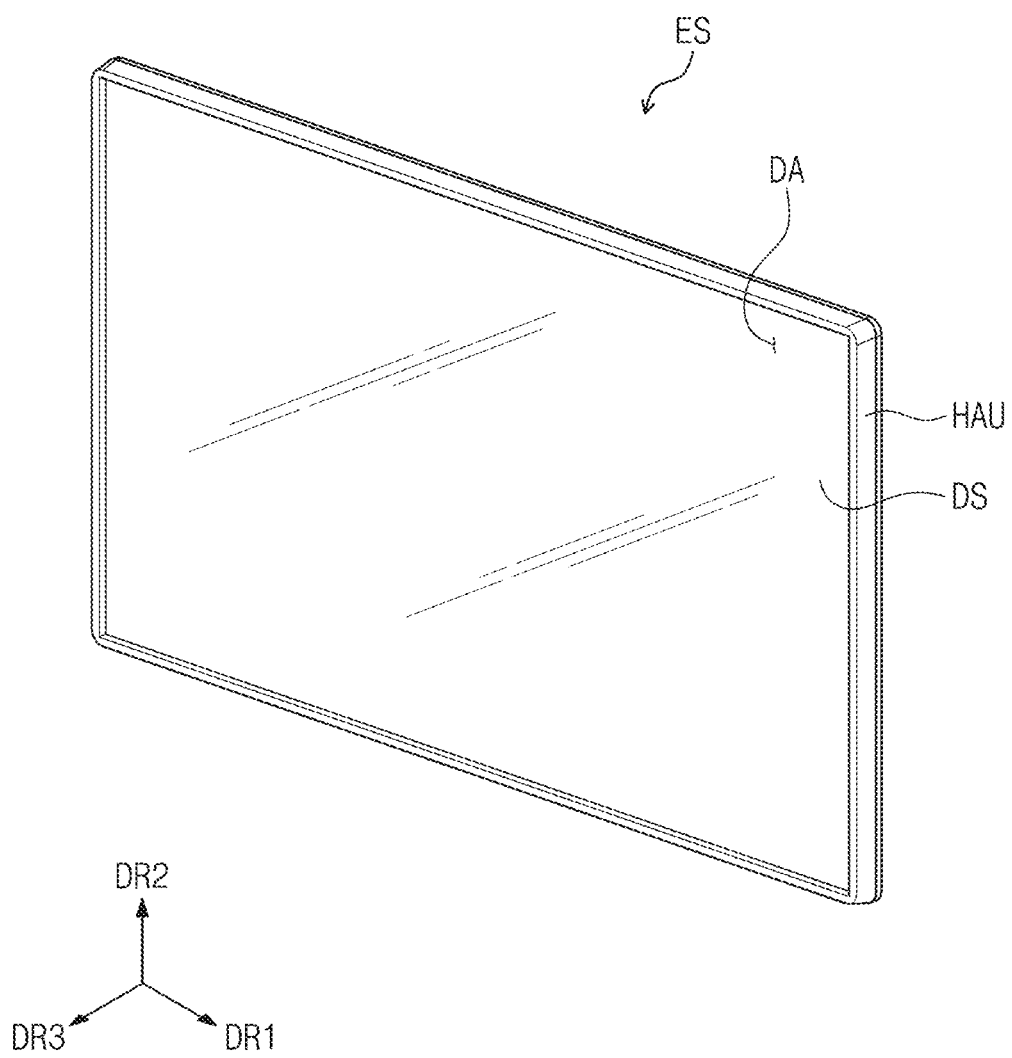
FIG. 1A is a perspective view of an electronic apparatus according to an exemplary embodiment of the present disclosure.

Hereinafter, it will be understood that when an element or layer is referred to as being "on," "connected to," or "coupled to" another element or layer, it can be directly on, connected, or coupled to the other element or layer or one or more intervening elements or layers may be present therebetween. In contrast, when an element is referred to as being "directly on," "directly connected to," or "directly coupled to" another element or layer, there are no intervening elements or layers present.

Like reference numerals refer to like elements throughout the present disclosure. In the drawings, a thickness, a ratio, and a dimension of components may be exaggerated for ease of description of the technical aspect. As used herein, the term "and/or" includes any and all combinations of one or more of the associated listed items.

It will be understood that, although the terms first, second, etc. may be used herein to describe various elements, components, regions, layers and/or sections, these elements, components, regions, layers, and/or sections should not be limited by these terms. These terms are only used to distinguish one element, component, region, layer, or section from another element, component, region, layer, or section. Thus, a first element, component, region, layer or section discussed herein could be termed a second element, component, region, layer or section without departing from the teachings of the present disclosure. As used herein, the singular forms, "a," "an," and "the" are intended to include the plural forms as well, unless the context clearly indicates otherwise.

Spatially relative terms, such as "beneath," "below," "lower," "above," "upper," and the like, may be used herein for ease of description to describe one element or feature's relationship to another element(s) or feature(s) as illustrated in the figures. It will be understood that the relative terms are intended to encompass different orientations of a device including an element in addition to the orientation illustrated in the figures. For example, if the device in one of the figures is turned over, elements described as being on a "lower" side of other elements would then be oriented to be on an "upper" side of the other elements. The exemplary term "lower" can, therefore, encompass both an orientation of "lower" and "upper" depending on the particular orientation of the figure. Similarly, if the device in one of the figures is turned over, elements described as "below" or "beneath" other elements would then be oriented to be "above" the other elements. The exemplary terms "below" or "beneath" can, therefore, encompass both an orientation of "above" and "below" depending on the particular orientation of the figure.

It will be further understood that the terms "includes" and/or "including", when used in the present disclosure, specify a presence of stated features, integers, steps, operations, elements, and/or components, but do not preclude a presence or an addition of one or more other features, integers, steps, operations, elements, components, and/or groups thereof.

Unless otherwise defined, terms (including technical and scientific terms) used herein have the same ordinary meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display device and a method of manufacturing the display device according to the present disclosure will be explained in detail with reference to accompanying drawings.

Figure 1B:
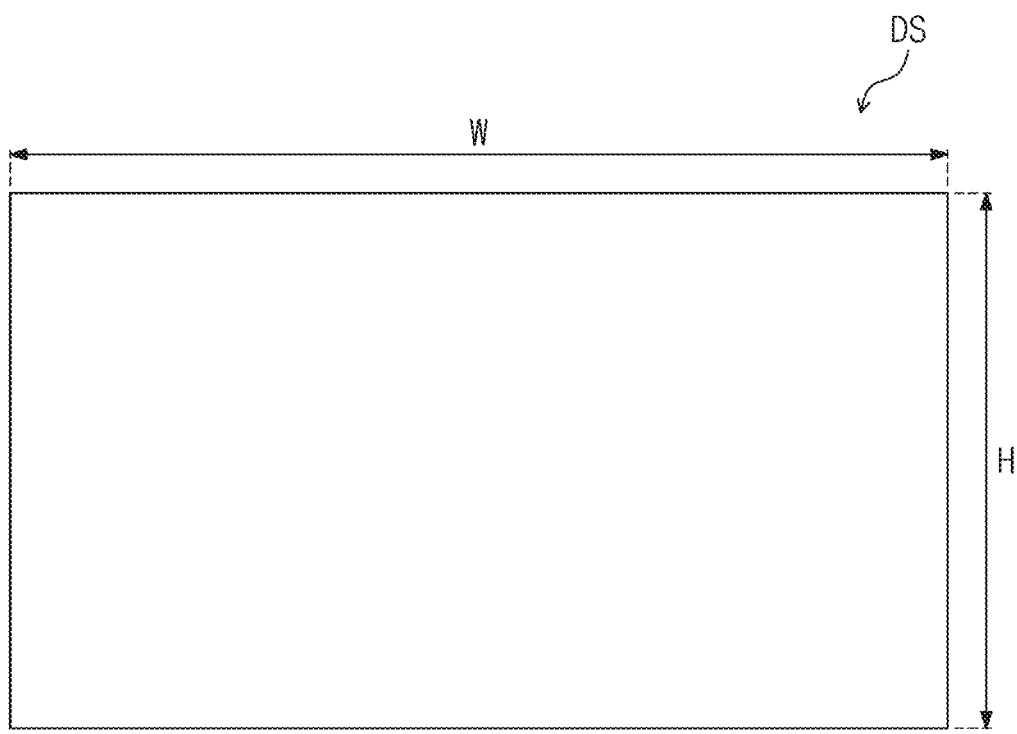
FIG. 1B is a plan view of a display device according to an exemplary embodiment of the present disclosure.
Figure 1B:
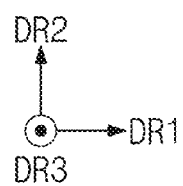
Figure 1C:
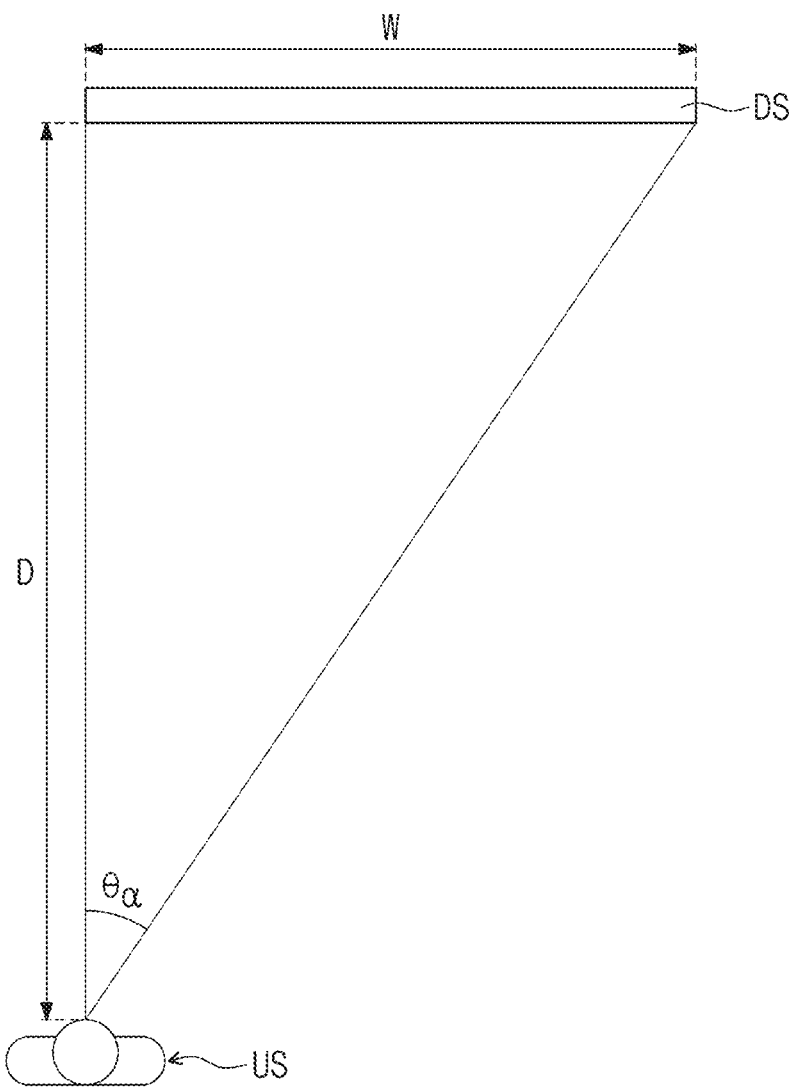
FIG. 1C is a side view of a display device according to an exemplary embodiment of the present disclosure.

FIG. 1A is a perspective view of an electronic apparatus ES according to an exemplary embodiment of the present disclosure. FIG. 1B is a plan view of a display device DS according to an exemplary embodiment of the present disclosure. FIG. 1C is a side view of the display device DS according to an exemplary embodiment of the present disclosure.

Referring to FIG. 1A, the electronic apparatus ES includes the display device DS and a housing HAU. The display device DS displays an image through a display area DA. In FIG. 1A, the display area DA may have a plane extending in a first direction DR1 and a second direction DR2 that crosses the first direction DR1, however, it is understood that the present disclosure is not limited thereto or thereby. According to another exemplary embodiment, the display area DA of the display device DS may have a curved surface.

A third direction DR3 corresponds to a thickness direction of the display device DS. Directions indicated by the first, second, and third directions DR1, DR2, and DR3 are relative to each other and may be changed to other directions. In the present disclosure, the expression "when viewed in a plane"

may indicate a state of being viewed in the third direction DR3. In addition, the expression "thickness direction" may refer to the third direction DR3.

FIG. 1A shows an example of the electronic apparatus ES including the display device DS applied to a flat-panel television. However, the display device DS may be applied to a large-sized electronic device, such as a monitor, an outdoor billboard, etc., and a small and medium-sized electronic device, such as a personal computer, a notebook computer, a personal digital assistants, a car navigation device, a game device, a smartphone, a tablet computer, a camera, etc., but it is understood that they are merely exemplary. The display device DS may be applied to other electronic devices without departing from the concept of the present disclosure.

The housing HAU may be coupled to the display device DS and may provide a predetermined inner space in which the display device DS is accommodated. The housing HAU may include a plurality of sidewalls, and the predetermined inner space may be formed by the sidewalls.

The housing HAU may include a material having a relatively high rigidity. For example, the housing HAU may include a plurality of frames and/or plates formed of a glass, plastic, or metal material, or a combination thereof. The housing HAU may stably protect components of the display device DS accommodated in the inner space from external impacts.

Referring to FIGS. 1B and 1C, the display device DS may have a rectangular shape when viewed in a plane. The display device DS may have a rectangular shape with a long axis extending in the first direction DR1 and a short axis extending in the second direction DR2. According to one embodiment, the long axis of the display device DS may have a first length W, and the short axis of the display device DS may have a second length H. The first length W may be, for example, in a range equal to or greater than about 700 mm and equal to or smaller than about 2000 mm. The second length H may be, for example, in a range equal to or greater than about 400 mm and equal to or smaller than about 1200 mm.

According to one embodiment, a user US may view an image provided by the display device DS at a distance equal to or greater than a minimum separation distance D. The minimum separation distance D may be four times greater than the second length H that is the length of the short axis of the display device DS. That is, the minimum separation distance D may be "4H" or greater. The user US may view the display device DS at a predetermined viewing angle at the minimum separation distance D or farther. A viewing angle θα (hereinafter, referred to as "outermost viewing angle θα) at a position corresponding to an outermost portion of the display device DS may correspond to an angle between imaginary lines that connect the user US to two opposite ends of the display device DS at a position that is substantially parallel to one end of the long axis of the display device DS and spaced apart from the display device DS by the minimum separation distance D. A length and a width of components included in the display device DS may be controlled depending on the outermost viewing angle θα to reduce a reflectance of the external light in the display device DS. The configurations related to the outermost viewing angle θα will be described later in further detail.

Figure 2:
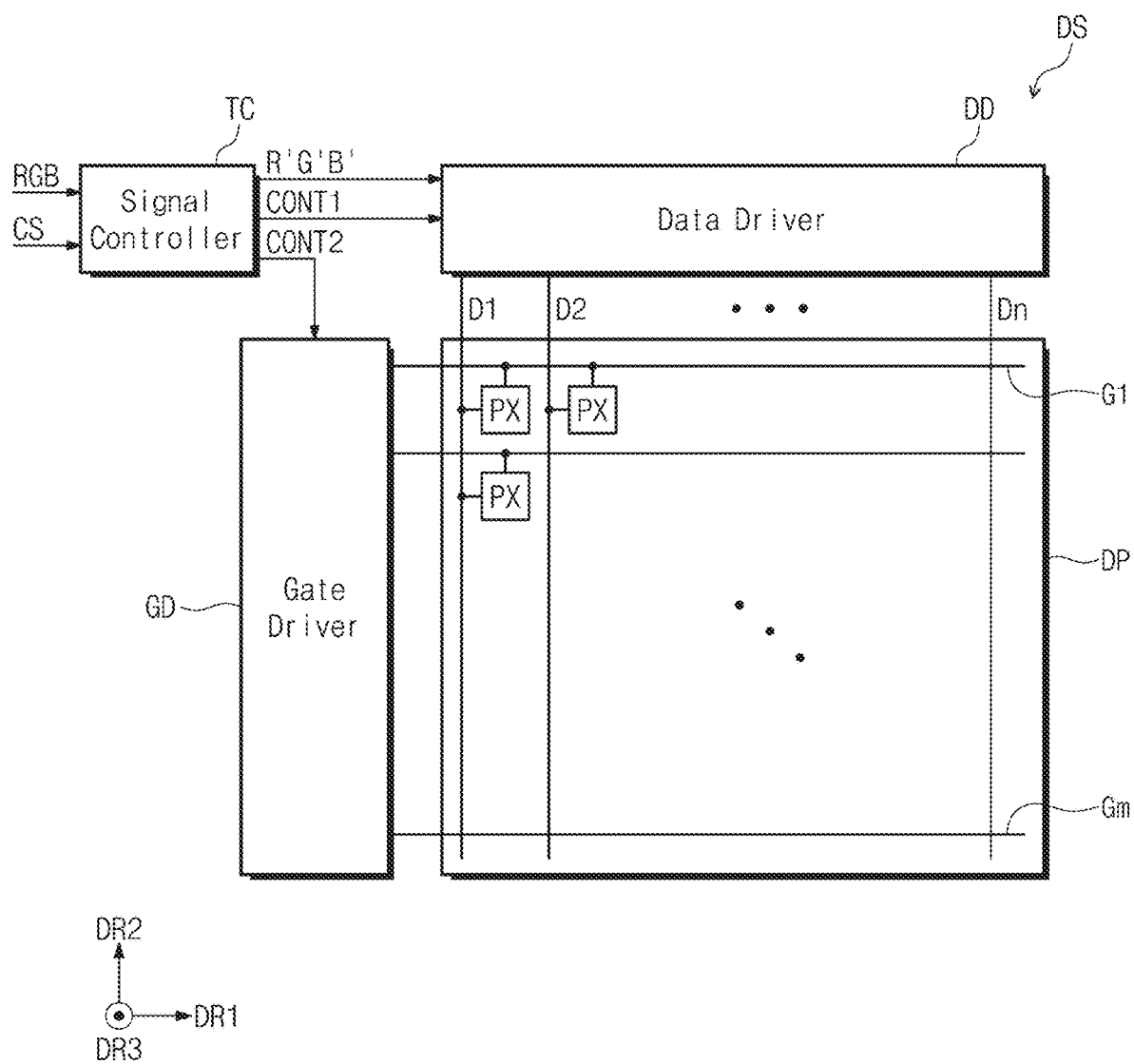
FIG. 2 is a block diagram of a display device according to an exemplary embodiment of the present disclosure.
Figure 3:
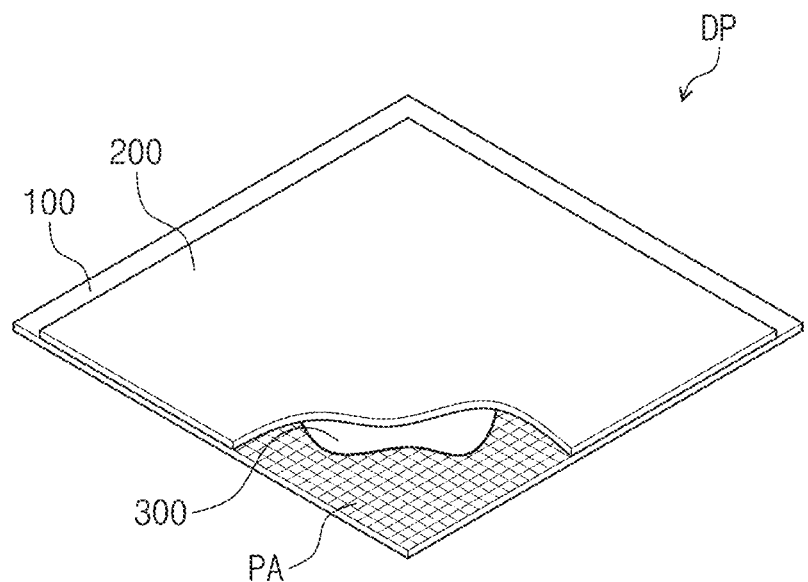
FIG. 3 is a perspective view of some components of the display device shown in FIG. 2.
Figure 3:
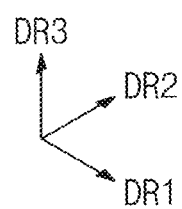

FIG. 2 is a block diagram showing the display device DS according to an exemplary embodiment of the present disclosure, and FIG. 3 is a perspective view of some components of the display device DS shown in FIG. 2. Hereinafter, the present disclosure will be described with reference to FIGS. 2 and 3.

Referring to FIG. 2, the display device DS may include a signal controller TC, a gate driver GD, a data driver DD, and a display panel DP.

The display panel DP may be electrically connected to the gate driver GD and the data driver DD and may be operated in response to electrical signals provided by the gate driver GD and the data driver DD. The display panel DP may be an organic light emitting display panel, a quantum-dot light emitting display panel, a liquid crystal display panel, a plasma display panel, an electrophoretic display panel, or an electrowetting display panel, however, it is understood that the present disclosure is not limited to a particular type of the display panel DP. In the present exemplary embodiment, a liquid crystal display device including the liquid crystal display panel will be described as a representative example of the display device DS.

The display device DS may further include a backlight (not shown) providing a light to the display panel DP and an optical member such as a polarizer. The display panel DP may control a transmission amount of the light emitted from the backlight to display the image. However, this is merely exemplary. In a case where the display panel DP is an organic light emitting display panel, the backlight may be omitted.

The display panel DP may include a plurality of signal lines and a plurality of pixels PX connected to the signal lines. The signal lines may include a plurality of gate lines G1 to Gm and a plurality of data lines D1 to Dn.

The gate lines G1 to Gm may extend in the first direction DR1 and may be arranged in the second direction DR2. The gate lines G1 to Gm may connect the gate driver GD to the pixels PX. The gate lines G1 to Gm may provide gate signals from the gate driver GD to the pixels PX, respectively.

The data lines D1 to Dn may extend in the second direction DR2 and may be arranged in the first direction DR1. The data lines D1 to Dn may connect the data driver DD to the pixels PX. The data lines D1 to Dn may provide data signals from the data driver DD to the pixels, respectively. The data lines D1 to Dn may be insulated from the gate lines G1 to Gm while crossing the gate lines G1 to Gm.

Each of the pixels PX may be connected to a corresponding gate line among the gate lines G1 to Gm and a corresponding data line among the data lines D1 to Dn. Each of the pixels PX may include a thin film transistor and a liquid crystal capacitor that is connected to the thin film transistor. The pixels PX may display an image by controlling an amount of electric charges of the liquid crystal capacitor. This will be described in detail later.

The signal controller TC may provide electrical signals to the gate driver GD and the data driver DD to control an operation of the gate driver GD and the data driver DD. The signal controller TC may receive input image signals RGB, convert the input image signals RGB to image data R'G'B', and output the image data R'G'B'. In addition, the signal controller TC may receive a variety of control signals CS including, but not limited to, a vertical synchronization signal, a horizontal synchronization signal, a main clock signal, and a data enable signal, and may output first and second control signals CONT1 and CONT2.

The data driver DD may receive the first control signal CONT1 and the image data R'G'B'. The data driver DD may convert the image data R'G'B' to data voltages and may provide the data voltages to the data lines D1 to Dn. The first control signal CONT1 may include a horizontal start signal that starts the operation of the data driver DD, an inversion signal inverting a polarity of the data voltages, and an output signal that determines an output timing of the data voltages from the data driver DD.

The gate driver GD may receive the second control signal CONT2 and output the gate signals to the gate lines G1 to Gm in response to the second control signal CONT2. The second control signal CONT2 may include a vertical start signal that starts the operation of the gate driver GD, a gate clock signal that determines an output timing of a gate voltage, and an output enable signal that determines an ON pulse width of the gate voltage.

Referring to FIG. 3, the display panel DP may include a first substrate 100, a second substrate 200, and a liquid crystal layer 300. The first substrate 100 may include a plurality of pixel areas PA. The pixels PX may be arranged in the pixel areas PA, respectively. In the present exemplary embodiment, the pixel areas PA may correspond to areas in which lights displayed by the pixels PX are displayed, respectively. Although not shown in the figures, the first substrate 100 may include one or more components of the pixels PX.

The second substrate 200 may be disposed on the first substrate 100. Although not shown in the figures, the second substrate 200 may include one or more components of the pixels PX.

The liquid crystal layer 300 may be disposed between the first substrate 100 and the second substrate 200. The liquid crystal layer 300 may include liquid crystal molecules (not shown). The liquid crystal molecules may include a material whose alignment is controlled by an electric field formed in the pixel areas PA. The liquid crystal layer 300 may correspond to a portion of the pixels PX.

Figure 4A:
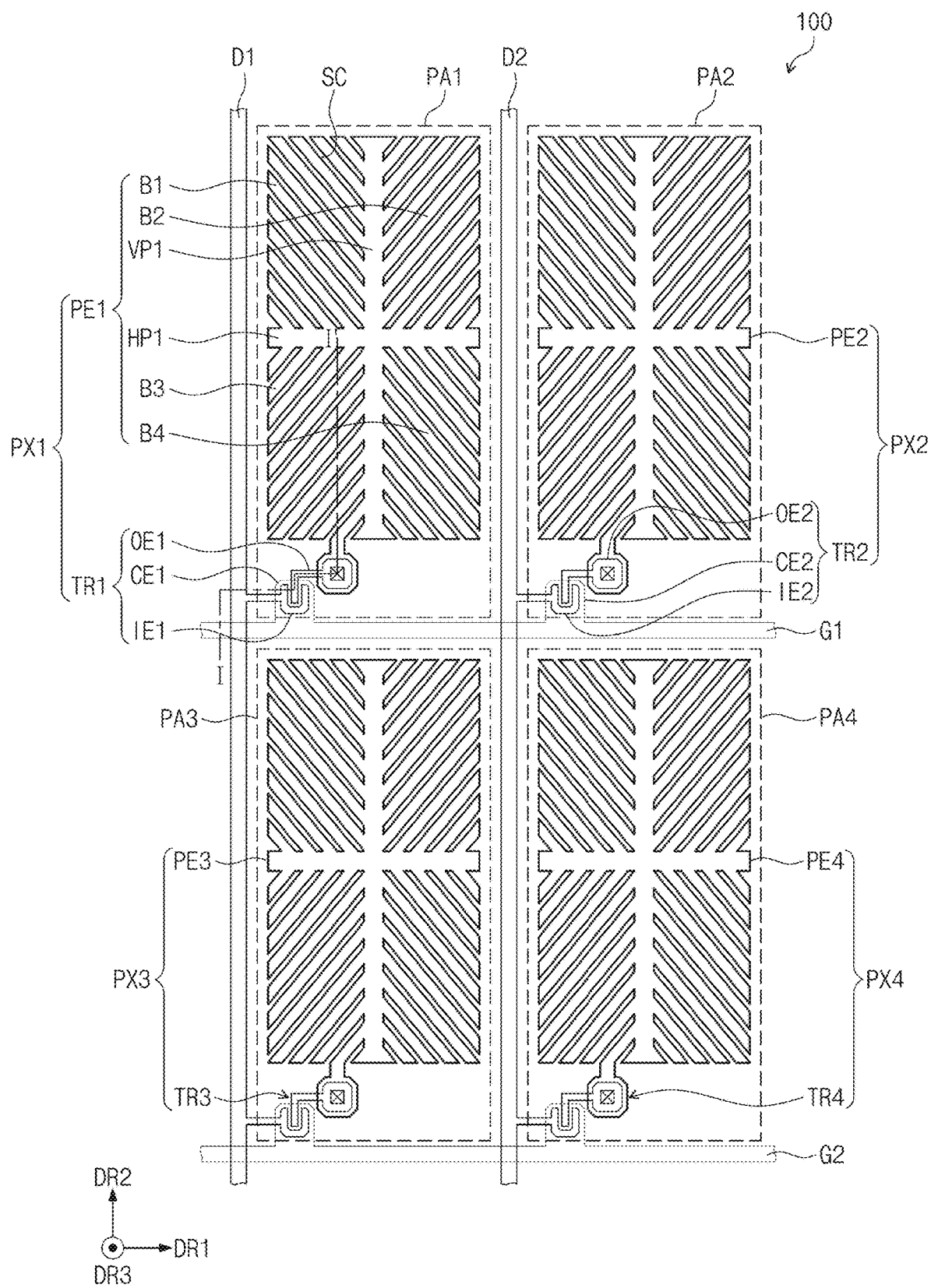
FIG. 4A is a plan view of a portion of a display panel according to an exemplary embodiment of the present disclosure.
Figure 4B:
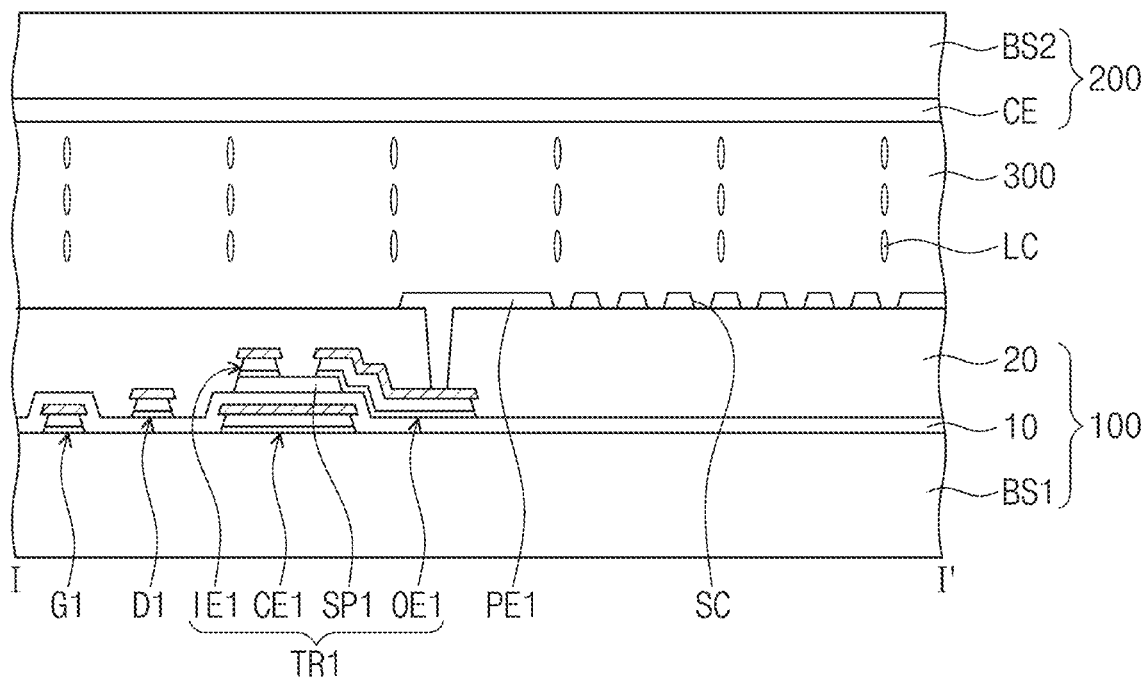
FIG. 4B is a cross-sectional view taken along a line I-I' shown in FIG. 4A.

FIG. 4A is a plan view of a portion of the display panel DP according to an exemplary embodiment of the present disclosure, and FIG. 4B is a cross-sectional view taken along a line I-I' shown in FIG. 4A. FIG. 4A shows a portion of the first substrate 100 corresponding to four pixel areas PA1, PA2, PA3, and PA4 adjacent to each other among the pixel areas PA (refer to FIG. 3) shown in FIG. 3. Hereinafter, the present disclosure will be described with reference to FIGS. 4A and 4B.

Four pixels PX1, PX2, PX3, and PX4 may be arranged in the four pixel areas PA1, PA2, PA3, and PA4. Each of the four pixels PX1, PX2, PX3, and PX4 may be connected to the corresponding gate line and the corresponding data line. A first pixel PX1 may be connected to a first gate line G1 and a first data line D1, and a second pixel PX2 may be connected to the first gate line G1 and a second data line D2. A third pixel PX3 may be connected to a second gate line G2 and the first data line D1, and a fourth pixel PX4 may be connected to the second gate line G2 and the second data line D2. In the present exemplary embodiment, for the convenience of explanation, the pixel area PA1 (hereinafter referred to as a "first pixel area") among the four pixel areas PA1, PA2, PA3, and PA4 will be described as a representative example.

The first pixel area PA1 may correspond to the first pixel PX1 is displayed, the second pixel area PA2 may correspond to the second pixel PX2, the third pixel area PA3 may correspond to the third pixel PX3, and the fourth pixel area PA4 may correspond to the fourth pixel PX4. The pixels PX may be arranged in other pixel areas PA may have a structure corresponding to that of the first pixel PX1, the second pixel PX2, the third pixel PX3, and the fourth pixel PX4. In another embodiment, the pixels PX arranged in the other pixel areas PA may have a structure that is different from that of the first pixel PX1, the second pixel PX2, the third pixel PX3, and the fourth pixel PX4, however, these are merely exemplary, and the present disclosure is not limited to these exemplary embodiments.

The first pixel PX1 may include a first thin film transistor TR1 and a first liquid crystal capacitor. The first liquid crystal capacitor may include a first pixel electrode PE1, a common electrode CE, and the liquid crystal layer 300 interposed between the first pixel electrode PE1 and the common electrode CE.

The second pixel PX2 may include a second thin film transistor TR2 and a second liquid crystal capacitor. The second liquid crystal capacitor may include a second pixel electrode PE2, the common electrode CE, and the liquid crystal layer 300 interposed between the second pixel electrode PE2 and the common electrode CE.

The third pixel PX3 may include a third thin film transistor TR3 and a third liquid crystal capacitor. The third liquid crystal capacitor may include a third pixel electrode PE3, the common electrode CE, and the liquid crystal layer 300 interposed between the third pixel electrode PE3 and the common electrode CE.

The fourth pixel PX4 may include a fourth thin film transistor TR4 and a fourth liquid crystal capacitor. The fourth liquid crystal capacitor may include a fourth pixel electrode PE4, the common electrode CE, and the liquid crystal layer 300 interposed between the fourth pixel electrode PE4 and the common electrode CE.

The first substrate 100 may include a first base layer BS1, the first gate line G1, the second gate line G2, the first data line D1, the second data line D2, a plurality of thin film transistors including the first thin film transistor TR1, the second thin film transistor TR2, the third thin film transistor TR3, and the fourth thin film transistor TR4, a plurality of pixel electrodes including the first pixel electrode PE1, the second pixel electrode PE2, the third pixel electrode PE3, and the fourth pixel electrode PE4, a first alignment layer, and a plurality of insulating layers including a first insulating layer 10, and a second insulating layer 20.

The first base layer BS1 may include an insulating material. In one embodiment, the first base layer BS1 may be optically transparent. In this case, the light generated by a backlight unit (not shown) disposed under the first base layer BS1 may reach the liquid crystal layer 300 after passing through the first base layer BS1. For example, the first base layer BS1 may include a glass substrate or a plastic substrate.

The first gate line G1 and the second gate line G2 may be disposed between the first base layer BS1 and the first insulating layer 10. A portion of the first gate line G1 may protrude in a direction substantially parallel to the second direction DR2, and the protruded portion may serve as a first control electrode CE1. The first thin film transistor TR1 may be connected to the first gate line G1 and may receive a gate signal from the first gate line G1.

The first insulating layer 10 may cover the first gate line G1 and the first control electrode CE1. The first insulating layer 10 may include an organic material and/or an inorganic material.

A first semiconductor pattern SP1 may be disposed on the first insulating layer 10. The first semiconductor pattern SP1 may be spaced apart from the first control electrode CE1 with the first insulating layer 10 interposed therebetween when viewed in a cross-section.

The first semiconductor pattern SP1 may include a semiconductor material. For example, the semiconductor material may include at least one of amorphous silicon, polycrystalline silicon, crystalline silicon, oxide semiconductor, and compound semiconductor.

The second insulating layer 20 may cover a first input electrode IE1 and a first output electrode OE1. The second insulating layer 20 may include an organic material and/or an inorganic material. The first input electrode IE1 and the first output electrode OE1 may be disposed between the first insulating layer 10 and the second insulating layer 20.

The first input electrode IE1 may correspond to a portion protruding from the first data line D1 in a direction substantially parallel to the first direction DR1. The first input electrode IE1 and the first output electrode OE1 may be disposed in the same layer as the first data line D1.

The first input electrode IE1 may have a shape that surrounds one end of the first output electrode OE1 when viewed in a plane. The other end of the first output electrode OE1 may extend from the one end and may be in contact with the first pixel electrode PE1 through a contact hole. Each of the first input electrode IE1 and the first output electrode OE1 may be disposed in the same layer as the first semiconductor pattern SP1 and may be in contact directly with the first semiconductor pattern SP1.

However, this is merely exemplary, and the first input electrode IE1 and the first output electrode OE1 may be disposed on a layer different from a layer in which the first semiconductor pattern SP1 is disposed and may be connected to the first semiconductor pattern SP1 through a separate contact hole, respectively. The first thin film transistor TR1 according to the exemplary embodiment of the present disclosure may have various structures, and the present disclosure is not limited to a particular embodiment.

At least one of the first and second gate lines G1 and G2 and the first and second data lines D1 and D2 may include a plurality of layers stacked on one another. In one embodiment, the first and second gate lines G1 and G2 may include a structure in which two layers are stacked and another layer having a protruding tip is disposed on the two layers. Each of the first and second gate lines G1 and G2 may include a side surface inclined with respect to the first base layer BS1 in a cross-section.

In one embodiment, the first and second data lines D1 and D2 may include a structure in which two layers are stacked and another layer having a protruding tip is further disposed on the two layers. Each of the first and second data lines D1 and D2 may include a side surface inclined with respect to the first base layer BS1 in a cross-section. The structure of the first and second data lines D1 and D2 may correspond to the structure of the first and second gate lines G1 and G2.

In the present exemplary embodiment, the first control electrode CE1 may protrude from the first gate line G1 and may have substantially the same structure as that of the first gate line G1. Similarly, the first input electrode IE1 protruding from the first data line D1 and may have substantially the same structure as that of the first data line D1.

However, this is merely exemplary, and the first and second data lines D1 and D2 may have a structure different from that of the first and second gate lines G1 and G2. For example, one of the first and second gate lines G1 and G2 and the first and second data lines D1 and D2 may selectively have a multi-layer structure, and the other one may have a single-layer structure. As another way, for example, one of the first and second gate lines G1 and G2 and the first and second data lines D1 and D2 may have an n-layer structure (n is a natural number), and the other one may have an m-layer structure (m is a natural number different from n). Depending on the layer structure of at least one of the first and second gate lines G1 and G2 and the first and second data lines D1 and D2, the external light reflectance of the display panel DP may be controllably reduced. This will be described in detail later.

The first pixel electrode PE1 may be disposed on the second insulating layer 20. The first pixel electrode PE1 and the second pixel electrode PE2 may be disposed to be spaced apart from each other with the second data line D2 interposed therebetween. The third pixel electrode PE3 and the fourth pixel electrode PE4 may be disposed to be respectively spaced apart from the first pixel electrode PE1 and the second pixel electrode PE2 with the first gate line G1 interposed therebetween.

The first pixel electrode PE1 may be connected to the first thin film transistor TR1 through the second insulating layer 20. The first pixel electrode PE1 may receive a voltage that is output from the first thin film transistor TR1.

The first pixel electrode PE1 may include a first vertical portion VP1, a first horizontal portion HP1, and a plurality of branch portions B1 to B4. The first vertical portion VP1, the first horizontal portion HP1, and the branch portions B1 to B4 may be connected to each other to form the first pixel electrode PE1 having an integral shape.

The first vertical portion VP1 may extend in the second direction DR2 substantially parallel to the first data line D1 and the second data line D2.

The first horizontal portion HP1 may be connected to the first vertical portion VP1. The first horizontal portion HP1 may extend in the first direction DR1. The first horizontal portion HP1 may cross the first vertical portion VP1 and may be connected to the first vertical portion VP1. In the present exemplary embodiment, the first vertical portion VP1 and the first horizontal portion HP1 are shown to cross each other at a center portion thereof, however, this is merely exemplary. The first horizontal portion HP1 may be arranged to be biased toward one end of the first vertical portion VP1 from the center portion of the first vertical portion VP1, or the first vertical portion VP1 may be arranged to be biased toward one end of the first horizontal portion HP1 from the center portion of the first horizontal portion HP1, however, it is understood that the present disclosure is not limited to these exemplary embodiments.

The branch portions B1 to B4 may be connected to the first horizontal portion HP1 or the first vertical portion VP1. Each of the branch portions B1 to B4 may extend in a direction crossing the first and second directions DR1 and DR2.

The branch portions B1 to B4 may extend from the first horizontal portion HP1 and the first vertical portion VP1 in a radial shape. The branch portions B1 to B4 may be classified into a plurality of branch portions according to the directions in which the branch portions B1 to B4 extend from the first horizontal portion HP1 or the first vertical portion VP1.

For example, the branch portions B1 to B4 may be classified into the first branch portion B1, the second branch portion B2, the third branch portion B3, and the fourth branch portion B4. Slits SC may be formed between adjacent ones of the first to fourth branch portions B1 to B4. The slits SC may correspond to distances between adjacent ones of the branch portions B1 to B4.

According to one embodiment, the first pixel electrode PE1 may display a plurality of grayscales in a single pixel area (e.g., the first pixel area PA1) corresponding to each of the branch portions B1 to B4. For example, a first area in which the first branch portions B1 are arranged, a second area in which the second branch portions B2 are arranged, a third area in which the third branch portions B3 are arranged, and a fourth area in which the fourth branch portions B4 are arranged may form a plurality of domains that is distinct from one another.

The alignment of liquid crystal molecules of the liquid crystal layer 300 may be controllably changed depending on the directions in which the branch portions B1 to B4 extend. Accordingly, the display panel DP may display various grayscales in each of the domains of the single pixel area and may display an image having improved color reproducibility and a high resolution.

Referring to FIG. 4B, the second substrate 200 may include a second base layer BS2 and the common electrode CE. The second base layer BS2 may be an insulating substrate that is optically transparent.

The common electrode CE and the first pixel electrode PE1 may form an electric field. The common electrode CE may overlap each of the first to fourth pixel electrodes PE1, PE2, PE3, and PE4. Each of the first to fourth pixel electrodes PE1, PE2, PE3, and PE4 may form a respective liquid crystal capacitor (i.e., the first to fourth liquid crystal capacitors) together with the common electrode CE and the liquid crystal layer 300.

Although not shown in the figures, the display panel DP may further include a plurality of alignment layers. For example, the alignment layers may be disposed between the liquid crystal layer 300 and the second insulating layer 20 and between the liquid crystal layer 300 and the common electrode CE, respectively. Each of the alignment layers may control an initial alignment of the liquid crystal molecules LC.

Figure 5A:
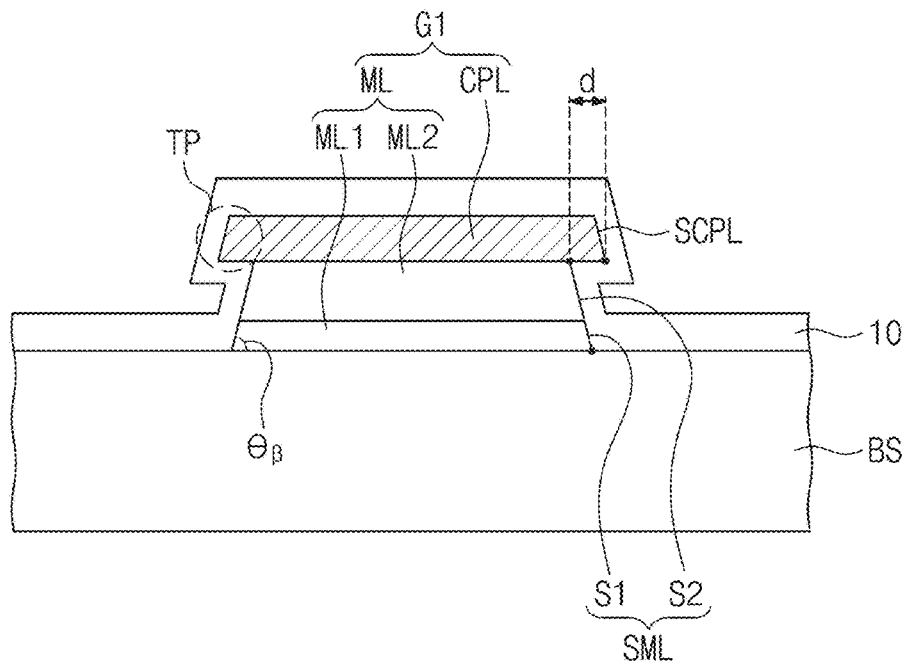
FIGS. 5A and 5B are cross-sectional views of a display panel according to an exemplary embodiment of the present disclosure.
Figure 5B:
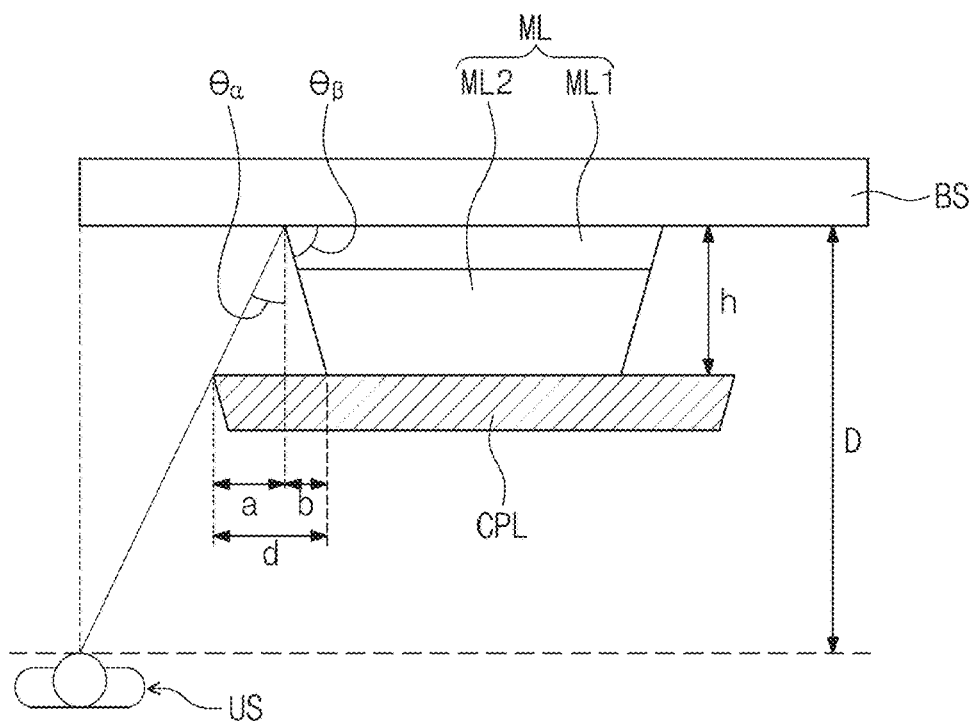
Figure 6:
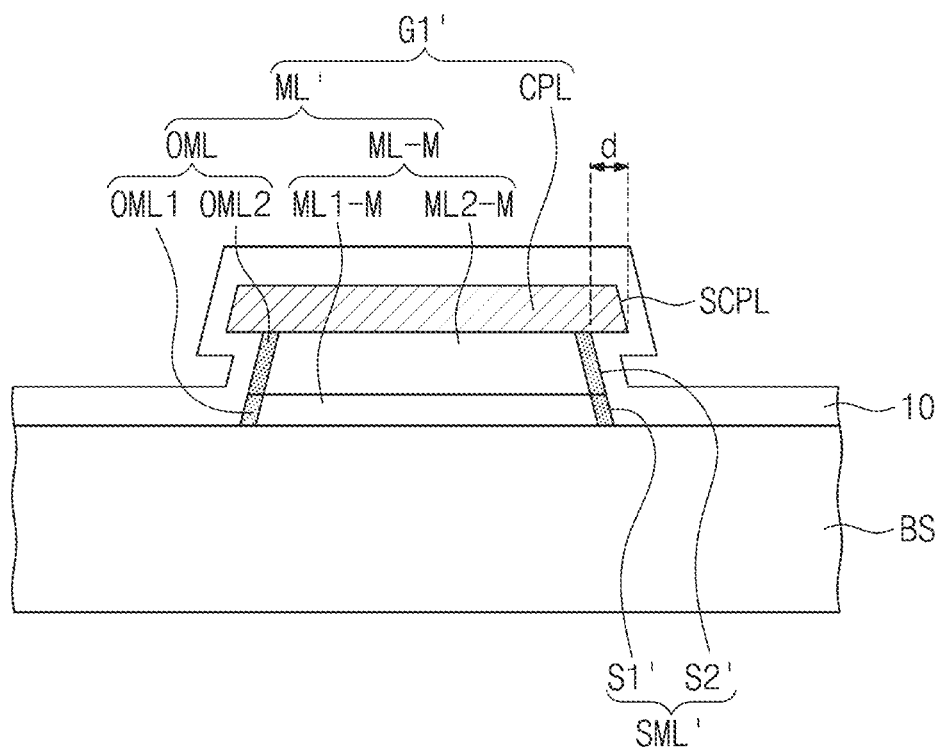
FIG. 6 is a cross-sectional view of some components of a display panel according to another exemplary embodiment of the present disclosure.

FIGS. 5A and 5B are cross-sectional views of the display panel DP according to an exemplary embodiment of the present disclosure. FIG. 6 is a cross-sectional view of the display panel DP according to another exemplary embodiment of the present disclosure. FIGS. 5A, 5B show cross-sections of the first gate line G1, and FIG. 6 shows a cross-section of a first gate line G1'. Hereinafter, the first gate lines G1 and G1' according to the exemplary embodiments of the present disclosure will be described with reference to FIGS. 5A, 5B, and 6. The same reference numerals denote the same element of FIGS. 1A to 4B, and detailed descriptions of the same elements will be omitted.

Referring to FIGS. 5A and 5B, the first gate line G1 according to the exemplary embodiment of the present disclosure may include a metal layer ML and a capping layer CPL that is disposed on the metal layer ML. The metal layer ML and the capping layer CPL may be sequentially stacked on the base layer BS in the thickness direction of the base layer BS.

The metal layer ML may include a single layer or a plurality of layers. FIGS. 5A and 5B show a structure in which the metal layer ML includes two layers, e.g., a first metal layer ML1 and a second metal layer ML2, as a representative example, however, it is understood that the present disclosure is not limited thereto or thereby. The metal layer ML may include a single metal layer or three or more metal layers that are sequentially stacked.

The first metal layer ML1 may contain a first metal material, and the second metal layer ML2 may contain a second metal material. The first metal material and the second metal material may be different from each other. For example, the first metal layer ML1 may include a first metal material having a superior adhesion property to adhere to the base layer BS and may include a refractory metal material having superior processability. In the present disclosure, the "refractory metal material" may refer to a metal or a metal alloy having a melting point higher than about 1500 Celsius degrees, e.g., niobium (Nb), vanadium (V), tantalum (Ta), titanium (Ti), zirconium (Zr), hafnium (Hf), molybdenum (Mo), rhenium (Re), or tungsten (W). In the exemplary embodiment, the first metal material may be titanium (Ti). The second metal layer ML2 may include a second metal material having a low electrical resistance and superior electrical conductivity. The electrical conductivity of the second metal layer ML2 may be greater than the electrical conductivity of the first metal layer ML1. For example, the second metal layer ML2 may include copper (Cu), silver (Ag), aluminum (Al) or an alloy thereof. In the exemplary embodiment, the second metal material may be copper (Cu).

In the exemplary embodiment, a total thickness h of the metal layer ML may be equal to a sum of a thickness of the first metal layer ML1 and a thickness of the second metal layer ML2. The thickness h of the metal layer ML may be in a range equal to or greater than about 5000 angstroms and equal to or smaller than about 10000 angstroms. The thickness of the second metal layer ML2 may be greater than the thickness of the first metal layer ML1. For example, the thickness of the first metal layer ML1 may be in a range from about 50 angstroms to about 500 angstroms, and the thickness of the second metal layer ML2 may be in a range from about 4500 angstroms to about 9500 angstroms. The metal layer ML having a thickness in the above-mentioned range may impart the electrical characteristics of the first gate line G1 that includes the metal layer ML.

The metal layer ML may include a sidewall SML that is inclined at a predetermined angle $\theta_\beta$ (hereinafter referred to as a "taper angle") with respect to an upper surface of the base layer BS. The first metal layer ML1 may include a first sidewall S1, and the second metal layer ML2 may include a second sidewall S2. The first sidewall S1 and the second sidewall S2 may be aligned along an imaginary straight line inclined at the taper angle $\theta_\beta$. That is, the first sidewall S1 and the second sidewall S2 may be aligned with each other to form the sidewall SML of the metal layer ML. However, it is understood that the present disclosure is not limited thereto or thereby, and the first sidewall S1 and the second sidewall S2 may be inclined at different inclination angles from each other. In the sidewall SML of the metal layer ML, the first sidewall S1 and the second sidewall S2 may be inclined by different inclination angles due to a difference in an etching speed between the first metal material included in the first metal layer ML1 and the second metal material included in the second metal layer ML2.

In one embodiment, the capping layer CPL may include molybdenum and tantalum. In another embodiment, the capping layer CPL may include molybdenum oxide ($MoO_2$) and tantalum oxide (TaO). In yet another embodiment, the capping layer CPL may include a material represented by $Mo_xTa_yO_z$. A content ratio of molybdenum to tantalum in the capping layer CPL may be from about 80:20 to about 97:3. The content ratio of tantalum to the total metal material in the capping layer CPL may be in a range of about 3 atomic percentage (at %) or more to about 20 at % or less. The capping layer CPL containing tantalum content in the above-mentioned range may effectively reduce light reflectance.

The capping layer CPL may have a light reflectance lower than that of the metal layer ML. In the exemplary embodiment, the capping layer CPL may have an average light reflectance equal to or smaller than about 20% in a wavelength range that is equal to or greater than about 400 nm and equal to or smaller than about 800 nm.

The capping layer CPL may have a thickness equal to or greater than about 500 angstroms and equal to or smaller than about 1500 angstroms. For example, the thickness of the capping layer CPL may be equal to or greater than about 900 angstroms and equal to or smaller than about 1100 angstroms. The capping layer CPL having a thickness in the above-mentioned range may effectively reduce the light reflectance of the first gate line G1.

The capping layer CPL may be in contact with the metal layer ML. In this case, no other intervening components may be disposed between the capping layer CPL and the metal layer ML. The capping layer CPL may be disposed at an uppermost position of the first gate line G1. The capping layer CPL having low light reflectance and disposed at the uppermost position of the first gate line G1 may effectively reduce the external light reflectance of the first gate line G1.

According to one embodiment, the capping layer CPL may include a tip TP that protrudes from the sidewall SML of the metal layer ML. The tip TP may correspond to a sidewall SCPL of the capping layer CPL that protrudes more than the sidewall SML of the metal layer ML. The tip TP of the capping layer CPL may reduce or prevent reflection generated due to the sidewall SML of the metal layer ML by reducing the reflectance of the external light at the upper portion of the first gate line G1.

The tip TP may protrude more than an end portion of the metal layer ML. Because the tip TP of the capping layer CPL entirely overs the sidewall SML of the metal layer ML, the sidewall SML of the metal layer ML may not be exposed when viewed in a top view. Further, an end portion of the tip TP may protrude more than a portion at which an end portion of the metal layer ML is in contact with the base layer BS, the tip TP of the capping layer CPL may cover the sidewall SML of the metal layer ML when viewed in the top view. The portion at which the end portion of the metal layer ML is in contact with the base layer BS may correspond to a portion at which the sidewall S1 of the first metal layer ML1 is in contact with the base layer BS.

A protruding length d of the tip TP may be in a range equal to or greater than about 4000 angstroms and equal to or smaller than about 6000 angstroms. The protruding length d of the tip TP in this range may prevent the reflection caused by the metal layer ML and achieve a process reliability of forming the first gate line G1.

Referring to FIGS. 1C and 5B, the protruding length d of the tip TP may satisfy the following Inequality 1.

$$d \geq h/(\tan(90°-\theta_\alpha)) + h/(\tan(\theta_\beta)), \quad \text{Inequality 1}$$

where "d" denotes the length of the tip TP, and "h" denotes the thickness of the metal layer ML. "$\theta_\alpha$" denotes the outermost viewing angle of the display device DS, and "$\theta_\beta$" denotes the taper angle of the metal layer ML.

In the exemplary embodiment, the protruding length d of the tip TP may be equal to or greater than an expression in the right side of Inequality 1. Referring to FIG. 5B, "h/(tan (90°-$\theta_\alpha$))" in the right side of Inequality 1 may indicate a length of portion "a,", and "h/(tan($\theta_\beta$))" in the right side of Inequality 1 may indicate a length of portion "b." In other words, the protruding length d of the tip TP may be equal to or greater than a minimum length (a+b) so that a lower end of the metal layer ML is covered by the tip TP and is invisible to the user US when the user US sees the display device DS at the position of the outermost viewing angle $\theta_\alpha$ of the display device DS.

In the display device DS according to the exemplary embodiment of the present disclosure, although the user US may be able to see an image displayed through the display device DS at a minimum viewing angle point, i.e., at the position of the outermost viewing angle $\theta_\alpha$ of the display device DS, the metal layer ML included in the signal lines such as the first gate line G1 or G1' may be blocked by the tip TP of the capping layer CPL, and the metal layer ML may not be exposed. Accordingly, the reflection of the external light that is caused by the sidewall SML of the metal layer ML having the high reflectance may be prevented, and the external light reflectance of the display device DS may be reduced.

Referring to FIG. 6, the first gate line G1' may include a metal layer ML', the metal layer ML' may include a metal layer main body ML-M and a metal oxide layer OML that is disposed on a side surface of the metal layer main body ML-M. The metal oxide layer OML may be a metal oxide film formed by oxidizing a metal material included in the metal layer main body ML-M. In the exemplary embodiment, the metal layer main body ML-M may include a first metal layer main body ML1-M and a second metal layer main body ML2-M, and the metal oxide layer OML may include a first metal oxide layer OML1 that is disposed on a side surface of the first metal layer main body ML1-M and a second metal oxide layer OML2 that is disposed on a side surface of the second metal layer main body ML2-M. In the exemplary embodiment, the first metal layer main body ML1-M may include titanium (Ti), and the first metal oxide layer OML1 may include titanium oxide. In the exemplary embodiment, the second metal layer main body ML2-M may include copper (Cu), and the second metal oxide layer OML2 may include copper oxide. The metal oxide layer OML may be formed by depositing a single metal material or by sequentially depositing a plurality of metal materials and oxidizing a side surface of the metal material(s). In a case where the metal layer ML' includes the metal oxide layer OML, a sidewall SML' of the metal layer ML' may correspond to the metal oxide layer OML. The first gate line G1' may effectively block the reflection of the external light by the sidewall SML' of the metal layer ML' because the metal oxide layer OML is disposed on the sidewall SML' of the metal layer ML' and the metal oxide included in the metal oxide layer OML has the external light reflectance lower than that of the metal material included in the metal layer main body ML-M.

Figure 7:
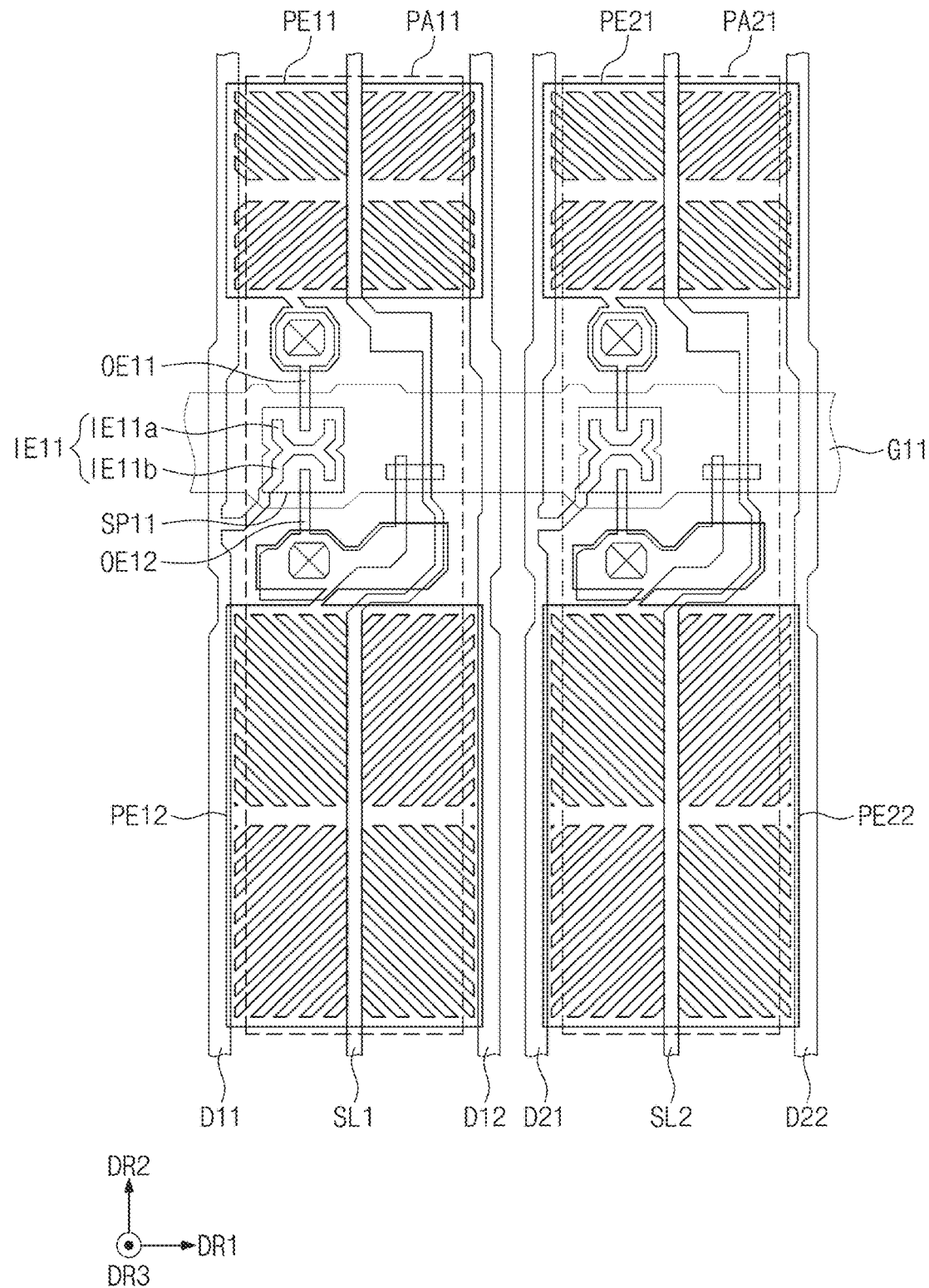
FIG. 7 is a plan view of a portion of a display panel according to an exemplary embodiment of the present disclosure.

FIG. 7 is a plan view of a portion of the display panel DP according to an exemplary embodiment of the present disclosure. FIG. 7 is a plan view of the first substrate 100 (refer to FIG. 4B) including a first pixel area PA11 and a second pixel area PA21. Hereinafter, the present disclosure will be described with reference to FIG. 7. The same reference numerals denote the same elements of FIGS. 1A to 6, and detailed descriptions of the same elements will be omitted.

Referring to FIG. 7, the first pixel area PA11 may be disposed between a first data line D11 and a second data line D12, and a first gate line G11 may cross the first pixel area PA11. A first sub-pixel electrode PE11 and a second sub-pixel electrode PE12, and a first thin film transistor and a second thin film transistor may be disposed in the first pixel area PA11.

A first semiconductor pattern SP11 may be disposed in the first pixel area PA11 and may overlap the first gate line G11. A portion of the first gate line G11 that overlaps the first semiconductor pattern SP11 may correspond to a first control electrode CE1 of the first thin film transistor.

An input electrode IE11 protruding from the first data line D11 may extend to overlap the first semiconductor pattern SP11. The input electrode IE11 may include a first input electrode IE11a that has a shape surrounding a portion of a first output electrode OE11 and a second input electrode IE11b that has a shape surrounding a portion of a second output electrode OE12.

A portion of the first gate line G11, a portion of the first semiconductor pattern SP11, the first input electrode IE11a, and the first output electrode OE11 may form the first thin film transistor that controls the first sub-pixel electrode PE11. A portion of the first gate line G11, a portion of the first semiconductor pattern SP11, the second input electrode IE11b, and the second output electrode OE12 may form the second thin film transistor that controls the second sub-pixel electrode PE12.

According to the present disclosure, the first and second thin film transistors disposed in the first pixel area PA11 may be commonly connected to the first gate line G11 and the first data line D11 and may respectively control voltages of the sub-pixel electrodes PE11 and PE12 that are distinguished from each other. Similarly, a third sub-pixel electrode PE21 and a fourth sub-pixel electrode PE22 that are disposed in the second pixel area PA21 may be controlled by a third thin film transistor and a fourth thin film transistor that are connected to the first gate line G11 and a third data line D21.

This is merely exemplary. The first and second pixel areas PA11 and PA21 according to the exemplary embodiment of the present disclosure may have a variety of pixel structures, and the present disclosure is not limited to the exemplary embodiment.

In the present exemplary embodiment, signal lines may overlap at least portions of the sub-pixel electrodes PE11, PE12, PE21, and PE22. For example, the first data line D11, the second data line D12, and a first conductive line SL1 may be disposed to overlap each of the first sub-pixel electrode PE11 and the second sub-pixel electrode PE12. For example, the third data line D21, a fourth data line D22, and a second conductive line SL2 may be disposed to overlap each of the third sub-pixel electrode PE21 and the fourth sub-pixel electrode PE22.

According to the present disclosure, at least one of the signal lines D11, D12, D21, D22, SL1, and SL2 may have a structure corresponding to the first gate lines G1 and G1' shown in FIGS. 5A and 6. That is, at least one of the signal lines D11, D12, D21, D22, SL1, and SL2 may include a metal layer and a capping layer, and a tip formed in the capping layer may have a structure satisfying Inequality 1.

Accordingly, although the signal lines D11, D12, D21, D22, SL1, and SL2 overlap the sub-pixel electrodes PE11, PE12, PE21, and PE22 and are arranged at a position visible to the user, the tip TP formed in the capping layer may reduce the reflection of the external light, and a visibility of the signal lines D11, D12, D21, D22, SL1, and SL2 may be reduced.

FIGS. 8A to 8D are cross-sectional views illustrating a method of manufacturing the display panel DP according to an exemplary embodiment of the present disclosure. The present disclosure will be described with reference to FIGS. 8A to 8D. The same reference numerals denote the same elements of FIGS. 1A to 7, and detailed descriptions of the same elements will be omitted.

Figure 8A:
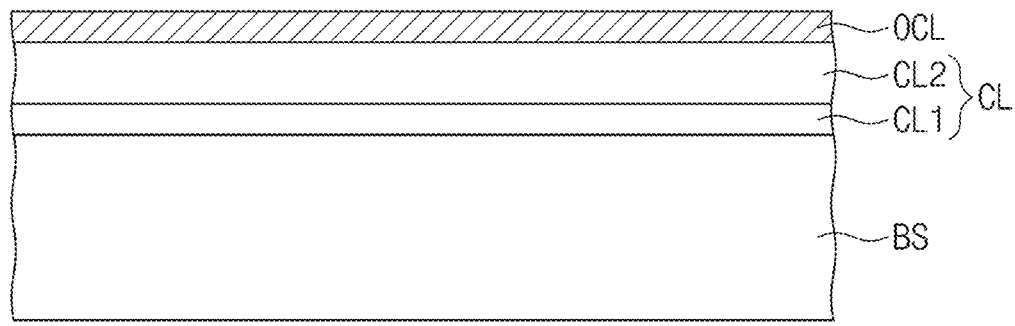
FIGS. 8A to 8D are cross-sectional views illustrating a method of manufacturing a display panel according to an exemplary embodiment of the present disclosure.

Referring to FIG. 8A, a conductive layer CL and an oxide layer OCL are sequentially deposited on the base layer BS. Each of the conductive layer CL and the oxide layer OCL may be formed through a deposition or coating process. The conductive layer CL and the oxide layer OCL may be formed through successive processes. The conductive layer CL may be formed by sequentially forming a first conductive layer CL1 and a second conductive layer CL2. In the exemplary embodiment, the first conductive layer CL1 may be formed by depositing titanium (Ti), and the second conductive layer CL2 may be formed by depositing copper (Cu). The oxide layer OCL may include molybdenum and tantalum. The content ratio of molybdenum to tantalum in the oxide layer OCL may be from about 80:20 to about 97:3. The content ratio of tantalum to the total metal material in the oxide layer OCL may be in a range of about 3 at % or more to about 20 at % or less.

Figure 8B:
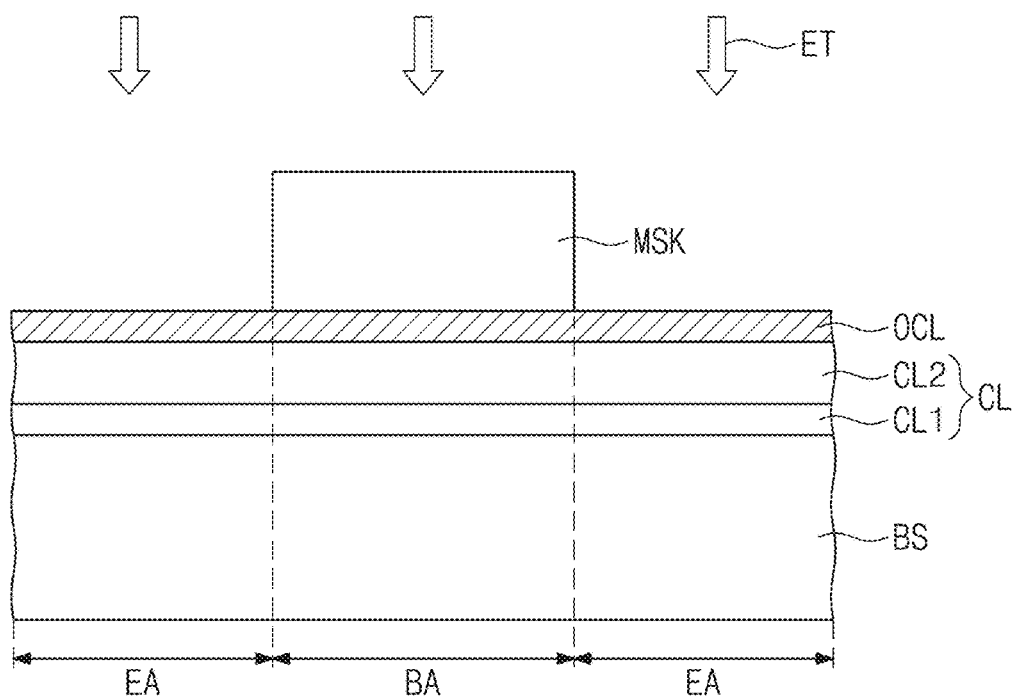
Figure 8C:
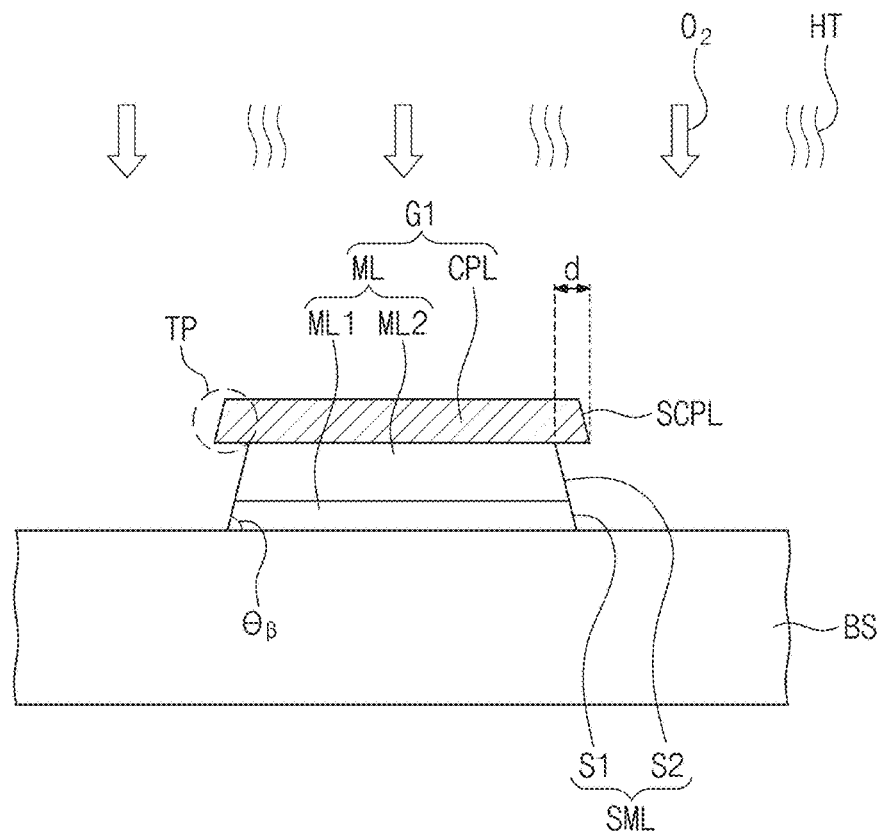

Referring to FIGS. 8B and 8C, the conductive layer CL and the oxide layer OCL may be patterned to form one of the signal lines. In the exemplary embodiment, the first gate line G1 may be formed through the patterning process.

The conductive layer CL and the oxide layer OCL may be patterned through an etch process. The etch process may be carried out by disposing a mask MSK above the conductive layer CL and the oxide layer OCL and providing an etchant ET. Portions of the conductive layer CL and the oxide layer OCL that are exposed without being covered by the mask MSK are etched and removed. In the exemplary embodiment, the mask MSK may include a photoresist (PR) material. The mask MSK may include a positive photoresist material or a negative photoresist material. In the exemplary embodiment, the etchant ET may be a non-hydrogen peroxide-based etchant. The conductive layer CL and the oxide layer OCL may be formed of materials that are reactive to the etchant ET. However, this is merely exemplary, the etchant ET may be selected from hydrogen peroxide-based etchants depending on materials for the conductive layer CL and the oxide layer OCL, and it is understood that the present disclosure is not limited to a particular etchant ET.

The conductive layer CL and the oxide layer OCL may be etched in the order in which they are first exposed to the etchant ET. The conductive layer CL and the oxide layer OCL may be etched by the etchant ET, and the first gate line G1 including the metal layer ML and the capping layer CPL may be formed. The metal layer ML may have a structure that includes the first metal layer ML1 containing titanium and the second metal layer ML2 containing copper that corresponds to the stacked structure of the first conductive layer CL1 and the second conductive layer CL2 as descried above. In the etch process, the tip TP may be formed in the oxide layer OCL according to a difference in etching rates of the conductive layer CL and the oxide layer OCL with respect to the etchant ET. The protruding length d of the tip TP may be controlled by the difference in the etching rates between the conductive layer CL and the oxide layer OCL. For example, the protruding length d of the tip TP may be controlled by the content of molybdenum and tantalum contained in the oxide layer OCL, a type of the etchant ET, and one or more etch process conditions. In the etch process of the conductive layer CL and the oxide layer OCL, the tip TP of the capping layer CPL may be formed to protrude more than the contact point at which one end of the conductive layer CL contacts with the base layer BS. The protruding length d of the tip TP may be formed to satisfy Inequality 1. In one embodiment, the capping layer CPL may be formed to have the protruding length d of the tip TP equal to or greater than about 4000 angstroms and equal to or smaller than about 6000 angstroms.

Figure 8D:
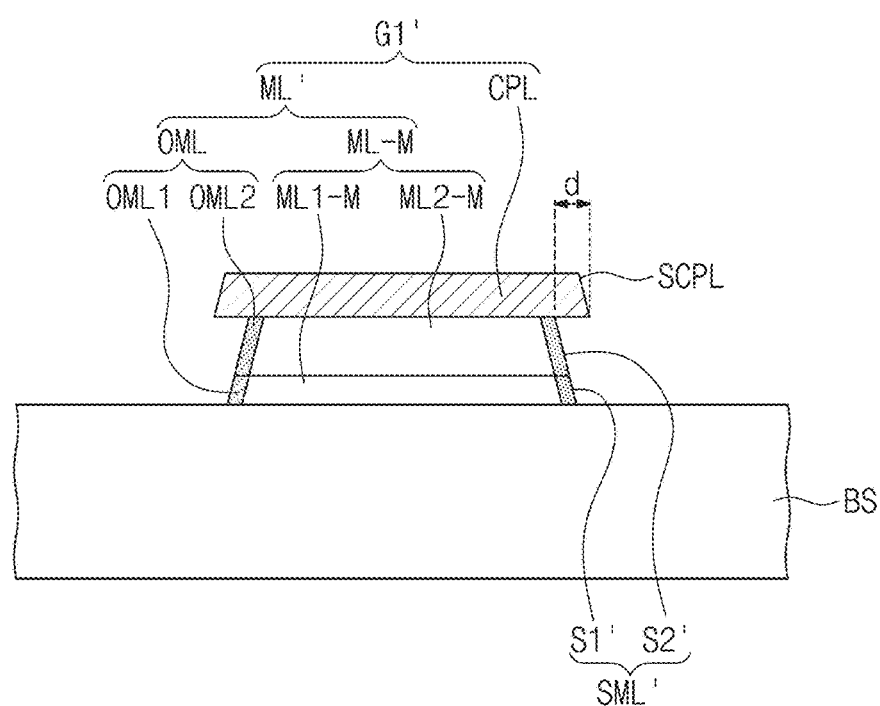

Referring to FIGS. 8C and 8D, the manufacturing method of the display panel DP further includes forming the metal oxide layer OML by applying heat HT to the first gate line G1 under an oxygen (O2) condition. The metal oxide layer OML may be formed by oxidizing the side surface of the metal layer ML under the oxygen (O2) condition. The metal oxide layer OML may include the first metal oxide layer OML1 and the second metal oxide layer OML2. In the exemplary embodiment, the first metal oxide layer OML1 may be a titanium oxide layer formed by oxidizing titanium contained in the first metal layer ML1, and the second metal oxide layer OML2 may be a copper oxide layer formed by oxidizing copper contained in the second metal layer ML2.

According to the manufacturing method of the display device DS of the exemplary embodiment, a signal line is formed to include the tip TP in the capping layer CPL with a predetermined length by controlling the content ratio of tantalum to total metal material in the oxide layer OML. Accordingly, the metal layer included in the signal line such as the first gate line G1 is not exposed by the tip TP of the capping layer CPL, the reflection of the external light that is caused by the sidewall SML of the metal layer ML with high reflectance, may be prevented, and the external light reflectance of the display device DS is reduced.

Figure 9:
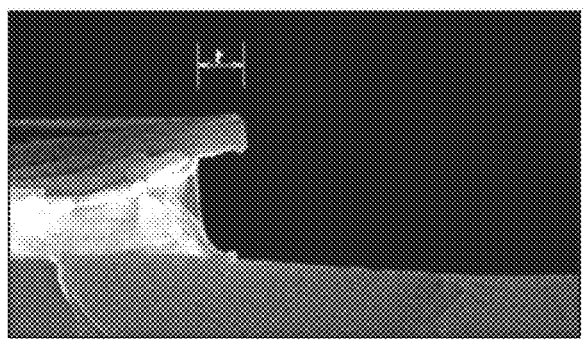
FIG. 9 is a scanning electron microscope (SEM) image showing a cross-section of a signal line of an embodiment example and signal lines of comparison examples.
Figure 9:
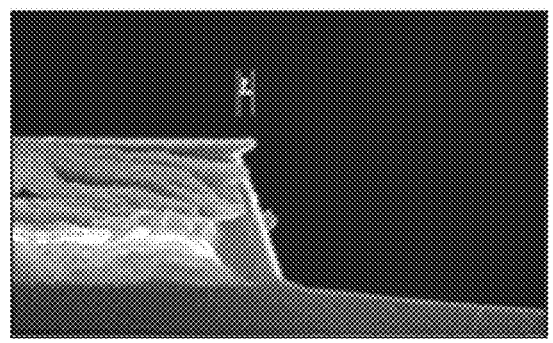
Figure 9:
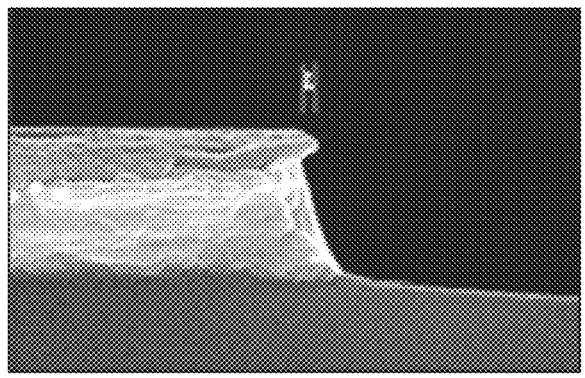
Figure 9:
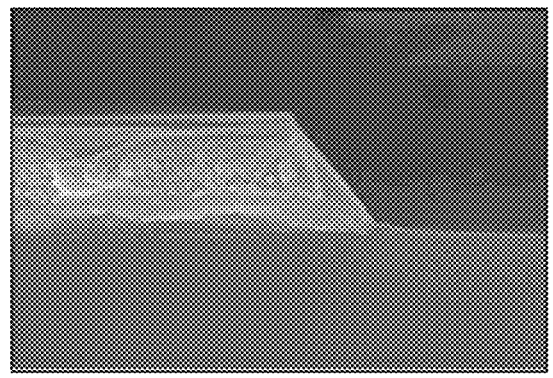

FIG. 9 is a scanning electron microscope (SEM) image showing a cross-section of a signal line in the present display device DS and signal lines of comparative examples. In FIG. 9, (a) shows an SEM image of a cross-section of the signal line according to the present embodiment, e.g., an SEM image showing the cross-section of the signal line in which the content ratio of tantalum to the total metal material in the capping layer CPL containing $Mo_xTa_yO_z$ is about 6 at %. In FIG. 9, (b), (c), and (d) show SEM images of cross-sections of the signal lines according to comparative examples in which the content ratios of tantalum to the total metal material in the capping layer CPL are about 2 at %, 1 at %, and 0, respectively.

Referring to FIG. 9, the tip TP of the capping layer CPL may protrude more than one end of the contact point between the metal layer ML included in the signal line and the base layer BS when viewed in a plane. Accordingly, the capping layer CPL may be formed such that the inclination surface of the metal layer ML included in the signal line is not exposed when viewed in the plane, and the external light reflectance of the signal line light is reduced. However, according to the comparative examples, a portion or all the inclination surface of the metal layer ML included in the signal line is exposed when viewed in the plane. Accordingly, the external light is reflected on the inclination surface of the metal layer ML of the signal lines, and the reflectance of the external light of the display device may increase.

Although the exemplary embodiments of the present disclosure have been described, it is understood that the present disclosure should not be limited to these exemplary embodiments, and various changes and modifications can be made by one ordinary skilled in the art within the spirit and scope of the present disclosure as hereinafter claimed.

Therefore, the claimed subject matter should not be limited to any single embodiment described herein, and the scope of the present inventive concept shall be determined according to the entirety of the present disclosure including the attached claims.

What is claimed is:

1. A display device comprising:
   a base layer;
   a pixel disposed on the base layer and comprising a thin film transistor; and
   a signal line connected to the pixel,
   wherein the signal line comprises:
      a metal layer having a first light reflectance; and
      a capping layer disposed on the metal layer, containing molybdenum and tantalum, and having a second light reflectance lower than the first light reflectance of the metal layer,
   wherein the capping layer comprises a tip extending beyond a sidewall of the metal layer, and the tip extends beyond a contact point at which the sidewall of the metal layer contacts the base layer,
   wherein a length d of the tip satisfies a condition of $d \geq h/(\tan(90°-\theta_\alpha))+h/(\tan(\theta_\beta))$, where h denotes a first thickness of the metal layer, $\theta_\alpha$ denotes an outermost viewing angle of the display device, and $\theta_\beta$ denotes a taper angle of the metal layer.

2. The display device of claim 1, wherein the length d is equal to or greater than about 4000 angstroms and equal to or smaller than about 6000 angstroms.

3. The display device of claim 1, wherein the h is equal to or greater than about 5000 angstroms and equal to or smaller than about 10000 angstroms.

4. The display device of claim 1, wherein a content ratio of the molybdenum to the tantalum in the capping layer is from about 80:20 to about 97:3.

5. The display device of claim 1, wherein the capping layer has an average reflectance equal to or smaller than about 20% in a wavelength range that is equal to or greater than about 400 nm and equal to or smaller than about 800 nm, and the capping layer has a second thickness that is equal to or greater than about 500 angstroms and equal to or smaller than about 1500 angstroms.

6. The display device of claim 1, wherein the capping layer comprises molybdenum oxide ($MoO_2$) and tantalum oxide (TaO).

7. The display device of claim 1, wherein the metal layer comprises a first metal layer comprising a first metal material and a second metal layer comprising a second metal material, and the first metal layer and the second metal layer are sequentially stacked.

8. The display device of claim 7, wherein the first metal layer comprises a refractory metal including at least one of niobium (Nb), vanadium (V), tantalum (Ta), titanium (Ti), zirconium (Zr), hafnium (Hf), molybdenum (Mo), rhenium (Re), or tungsten (W), and the second metal layer comprises copper (Cu), silver (Ag), aluminum (Al) or an alloy thereof.

9. The display device of claim 1, wherein the metal layer comprises:
   a metal layer main body comprising a metal material; and
   a metal oxide layer disposed on a side surface of the metal layer main body,
   wherein the metal oxide layer corresponds to the sidewall of the metal layer.

10. The display device of claim 9, wherein the metal oxide layer comprises titanium oxide or copper oxide.

11. The display device of claim 9, wherein the metal layer comprises a first metal layer comprising a first metal material and a second metal layer comprising a second metal material, the first metal layer and the second metal layer are sequentially stacked,
   wherein the metal oxide layer comprises a first metal oxide layer comprising a first oxide of the first metal material and disposed on a first side surface of the first metal layer and a second metal oxide layer comprising a second oxide of the second metal material and disposed on a second side surface of the second metal layer.

12. The display device of claim 1, wherein the capping layer contacts with the metal layer.

13. The display device of claim 1, further comprising a first signal line disposed in a first layer and a second signal line disposed in a second layer that is different from the first layer, wherein the first signal line and the second signal line are spaced apart from each other with an insulating layer interposed between the first signal line and the second signal line, wherein the thin film transistor comprises a control electrode disposed in the first layer, an input electrode disposed in the second layer, and an output electrode disposed in the second layer and spaced apart from the input electrode, wherein a display element of the pixel is connected to the output electrode, and wherein at least one of the control electrode, the input electrode, and the output electrode comprises the metal layer and the capping layer.

14. The display device of claim 1, wherein the sidewall of the metal layer entirely overlaps the tip when viewed in the plane.

15. A display device comprising:
a base layer;
a pixel disposed on the base layer;
a first signal line connected to the pixel and disposed in a first layer; and
a second signal line connected to the pixel and disposed in a second layer that is different from the first layer,
wherein at least one of the first signal line and the second signal line comprises:
a metal layer having a first light reflectance; and
a capping layer disposed on the metal layer, containing molybdenum and tantalum, and having a second light reflectance lower than the first light reflectance of the metal layer,
wherein the capping layer comprises a tip protruding from a sidewall of the metal layer,
wherein the tip extends beyond a contact point at which the sidewall of the metal layer contacts with the base layer,
wherein a length of the tip is equal to or greater than about 4000 angstroms and equal to or smaller than about 6000 angstroms,
wherein a content ratio of the molybdenum to the tantalum in the capping layer is from about 80:20 to about 97:3, and
wherein a length d of the tip satisfies a condition of $d \geq h/(\tan(90°-\theta_\alpha)) + h/(\tan(\theta_\beta))$, where h denotes a first thickness of the metal layer, $\theta_\alpha$ denotes an outermost viewing angle of the display device, and $\theta_\beta$ denotes a taper angle of the metal layer.

16. A method of manufacturing a display device, comprising:
providing a conductive layer on a base layer;
providing an oxide layer comprising molybdenum and tantalum on the conductive layer;
forming a photoresist pattern on the oxide layer; and
etching the conductive layer and the oxide layer to form a signal line that comprises a metal layer and a capping layer,
wherein the capping layer comprises a tip protruding from a sidewall of the metal layer,
wherein the tip protrudes more than a contact point at which the sidewall of the metal layer contacts with the base layer when viewed in a plane, and
wherein a length d of the tip satisfies a condition of $d \geq h/(\tan(90°-\theta_\alpha)) + h/(\tan(\theta_\beta))$, where h denotes a first thickness of the metal layer, $\theta_\alpha$ denotes an outermost viewing angle of the display device, and $\theta_\beta$ denotes a taper angle of the metal layer.

17. The method of claim 16, further comprising heat-treating the signal line under an oxygen condition to form a metal oxide layer.

18. The method of claim 16, wherein a content ratio of the molybdenum to the tantalum in the oxide layer is from about 80:20 to about 97:3.

* * * * *